United States Patent [19]
Ishida et al.

[11] Patent Number: 6,051,473
[45] Date of Patent: Apr. 18, 2000

[54] FABRICATION OF RAISED SOURCE-DRAIN TRANSISTOR DEVICES

[75] Inventors: Emi Ishida, Sunnyvale; Scott Luning, San Francisco; Dong-Hyuk Ju, Cupertino; Don Draper, San Jose, all of Calif.

[73] Assignee: Advanced Micro Devices, Inc., Sunnyvale, Calif.

[21] Appl. No.: 08/755,222

[22] Filed: Nov. 22, 1996

[51] Int. Cl.⁷ .................................................. H01L 21/336
[52] U.S. Cl. ......................... 438/300; 438/308; 438/486; 438/558
[58] Field of Search .................... 438/300, 299, 438/303, 304, 305, 306, 307, FOR 180, FOR 363, 308, 486, 301, 558, 564

[56] References Cited

U.S. PATENT DOCUMENTS

| | | | |
|---|---|---|---|
| 4,471,522 | 9/1984 | Jambotkar | 438/289 |
| 4,803,173 | 2/1989 | Sill et al. | 438/303 |
| 4,845,046 | 7/1989 | Shimbo | 438/300 |
| 4,939,156 | 7/1990 | Shimbo | 438/307 |
| 4,978,629 | 12/1990 | Komori et al. | 438/303 |
| 4,992,388 | 2/1991 | Pfiester | 438/303 |
| 5,093,275 | 3/1992 | Tasch et al. | 438/300 |
| 5,108,937 | 4/1992 | Tsai et al. | 438/589 |
| 5,231,038 | 7/1993 | Yamaguchi et al. | 438/303 |
| 5,238,857 | 8/1993 | Sato et al. | 438/151 |
| 5,250,454 | 10/1993 | Maszara | 438/586 |
| 5,436,474 | 7/1995 | Banerjee et al. | 257/194 |
| 5,508,541 | 4/1996 | Hieda et al. | 257/301 |
| 5,545,579 | 8/1996 | Liang et al. | 438/305 |
| 5,824,586 | 10/1998 | Wollesen et al. | 438/300 |

FOREIGN PATENT DOCUMENTS

| | | | |
|---|---|---|---|
| 63-211762 | 9/1988 | Japan | 438/FOR 174 |

OTHER PUBLICATIONS

Kimura et al, "Short–Channel Effect–Suppressed Sub 0.1 $\mu$m Grooved–Gate MOSFET's with W gate", IEEE Transaction on Electron Device, vol. 42, Jan. 1995, No. 1, pp 96–99.

Raised Source/Drain MOSFET with Dual Sidewall Spacers, M. Rodder, D. Yeakley, IEEE V. 12, No. 3, Mar. 1991.

MOSFET Drain Engineering Analysis for Deep–Submicrometer Dimension: A New Structural Approach, Shin, et al., IEEE V. 39, No. 8, Aug. 1992.

*Primary Examiner*—Michael Trinh
*Attorney, Agent, or Firm*—Fliesler, Dubb, Meyer & Lovejoy LLP

[57] ABSTRACT

A process in accordance with the invention enables the manufacturability of raised source-drain MOSFETs. In accordance with the invention, a raised source-drain material, having a window therein, is formed over the substrate. A gate oxide and window sidewall oxides are subsequently formed. Dopants are diffused into the substrate. A gate is formed within the window.

9 Claims, 5 Drawing Sheets

OPTIONAL

FABRICATION OF RAISED SOURCE-DRAIN TRANSISTOR DEVICES

BACKGROUND OF THE INVENTION

1. Field of Invention

This invention relates to semiconductor device formation, and particularly to raised source-drain MOSFET device formation.

2. Related Art

One trend of the semiconductor industry is to make semiconductor devices as small as possible. Often, however, process technology or the methods used in forming many devices impose limitations on how small a device can be made.

A typical semiconductor device and a primary building block in the semiconductor industry is the metal oxide semiconductor field effect transistor (MOSFET). A cross-section of a MOSFET is shown in FIG. 1. A MOSFET is typically composed of a gate 120 and an insulating gate oxide layer 115 both formed over a silicon substrate 110. Gate 120 is usually composed of polysilicon. Within substrate 110 are formed deep source-drain regions 150 (sometimes referred to as heavily doped source and drain regions) and source-drain extension regions 130 (sometimes referred to as lightly doped source and drain regions). Generally, doped regions are regions containing a higher concentration of p-type or n-type dopants than the substrate. Source-drain extension regions 130 generally have a lower concentration of dopants compared to deep source-drain regions 150, although some technologies allow the regions to be doped at equivalent levels. Further source-drain extension regions 130 have a thickness $t_1$ which is smaller than thickness $t_2$ of deep source-drain regions 150. Shallow source-drain extension regions 130 are important for reducing hot carrier injection (HCI), which often occurs in scaled down (e.g., sub-micron) devices, and for maintaining other device characteristics such as threshold voltage rolloff, punchthrough, and other short channel characteristics. Thicker deep source-drain regions are generally important for lowering device resistivity, for maximizing drive current and for forming contacts.

In reducing the size of MOSFET devices, much of the focus has been on reducing the length L of the gate 120. As the gate length L is reduced, however, the device size must also be reduced in the vertical direction—that is, the source-drain extension region thickness $t_1$ must be reduced. Formation of shallow source-drain extension regions, however, requires precise control of dopant distribution on a fine scale. Unfortunately, while technology will allow other portions of MOSFET devices to be scaled smaller, e.g., gates scaled to sub-micron lengths, limitations in forming finely scaled source-drain extension regions have prevented semiconductor devices from reaching their smallest dimensions. These limitations often arise as a result of heat steps, including anneal processes which are required to repair and activate doped regions, but which also cause dopant diffusion.

One proposed structure which allows for smaller device scaling while avoiding small scale source-drain extension formation problems is a raised source-drain MOSFET. One type of raised source-drain MOSFET is the hot-carrier suppressed (HCS) MOSFET, a cross-section of which is shown in FIG. 2. An HCS MOSFET includes substrate 210, gate oxide 215 of approximately 70 Å in thickness, gate 220, and sidewall oxides 270 of approximately 200 Å in width. The HCS MOSFET has source and drain regions 240 in substrate 210.

Rather than using source-drain extension regions, an HCS MOSFET has elevated N⁻ epitaxial layers 250 which perform the same functions as source-drain extension regions in conventional MOSFETs but avoid the deepening diffusion problem in their formation. That is, layers 250 reduce, or suppress, hot-carrier injection. N⁻ layer 250 is approximately 1000 Å in thickness and has a doping concentration on the order of $10^{16}$ cm$^{-3}$.

In order to provide lower sheet and contact resistance, a second N⁺ epitaxial layer 260 is utilized. N⁺ layer 260 is approximately 1000 Å in thickness with a doping concentration on the order of $10^{20}$ cm$^{-3}$.

Because many of the functions of the deep source-drain regions of conventional MOSFETs are fulfilled by the second epitaxial layer 260, HCS MOSFET source and drain regions 240 can remain shallow, which is desirable in forming smaller devices, at approximately 600 Å with a doping concentration on the order of $10^{18}$. More detailed information regarding the general structure and performance of HCS MOSFET devices can be found in Shin et al., "*MOSFET Drain Engineering Analysis for Deep-Submicrometer Dimensions: A New Structural Approach,*" IEEE Transactions on Electron Devices, Vol. 39, No. 8 (August 1992).

While raised source-drain MOSFETs have comparable performance characteristics to those of conventional MOSFETs while at the same time permitting the formation of smaller devices when compared with conventional MOSFETS, use of raised source-drain MOSFETs has not become widespread. The devices are difficult to manufacture for at least three reasons. First, as shown in the HCS device of FIG. 2, the raised epitaxial layers 250 and 260 must be selectively grown, which is a difficult task involving high vacuum and chemical vapor deposition processes. Such processes further require expensive equipment, are difficult to control, critically rely on surface preparation, and are easily ruined by a small amount of contamination.

Second, source and drain regions 240 are doped using conventional methods, e.g., by ion implantation, prior to forming the epitaxial layers. For the same reasons that source-drain extension region depth in a conventional MOSFET is difficult to control, so too is it difficult to maintain shallow source and drain regions 240, which are desirable in forming small scale raised source-drain MOSFETs: the heat cycles in the epitaxial (epi) layer formation cause the dopants to diffuse.

Finally, the quality of the sidewall oxides 270 in these raised source-drain MOSFETs is generally lacking. Sidewalls of sufficient uniform thickness are necessary to control capacitance between the gate and the raised source-drain regions 250 and 260. Such sidewall oxides however, are generally grown or deposited on the gate prior to forming epi layers 250 and 260, and the ability to form sidewalls of adequate uniform thickness to sufficiently control capacitance is extremely difficult, particularly when subjected to the cycles required for epitaxy.

Therefore, it is desirable to develop a process that will allow for easier manufacturability of raised source-drain MOSFETs, and thus allow for semiconductor device formation of reduced size.

SUMMARY OF THE INVENTION

The present invention is generally directed toward a method of forming HCS MOSFET devices. Conventional methods for forming such devices have proven impractical due to difficulties in selectively epitaxially growing raised source and drain regions, controlling dopant diffusion, and forming quality sidewall oxides.

A method in accordance with one embodiment of the invention is generally as follows. A layer of material to be used for the raised source and drain regions is formed on a substrate. In one embodiment of the invention, such a layer is formed of doped amorphous silicon. A window is formed in the raised source-drain material, exposing a portion of the substrate. A gate oxide layer is formed on the exposed substrate and sidewall oxides are formed on the sidewalls of the window. Doped regions are formed in the substrate below the raised source-drain material by diffusion of dopants from the raised source-drain material. Finally the gate is formed in the window.

Alternatively, a method in accordance with a second embodiment of the invention is as follows. A layer of material which can be selectively etched with respect to silicon, such as oxide, is formed on the substrate. The selective material (e.g., oxide) is patterned and etched to form a reserved gate region. A layer of raised source-drain material is deposited over the gate region and the substrate. The resulting structure is planarized and the reserved gate region formed of selective material is removed, forming a window exposing a portion of the substrate. A gate oxide layer is formed on the exposed substrate and sidewall oxides are formed on the sidewalls of the window. Doped regions are formed in the substrate below the raised source-drain material via dopant diffusion from the raised source-drain material. Finally, the gate is formed in the window.

In one embodiment of the invention, the steps of forming the gate oxide layer, forming the sidewall oxides, and diffusing dopants into the substrate are performed simultaneously.

A method in accordance with the invention has several advantages. First, it enables the manufacturability of raised source-drain MOSFETs. Second, the process avoids damage to the gate and gate oxide due to high temperature processing and other processes leading to charging. Third, the resulting structure is planar, allowing an easier contact etch than with other semiconductor devices. Finally, the method allows many steps to be performed simultaneously, which reduces process steps and other manufacturing costs.

BRIEF DESCRIPTION OF THE DRAWINGS

The present invention is described with respect to particular exemplary embodiments thereof and reference is accordingly made to the drawings (which are not necessarily drawn to scale), wherein like reference numbers denote like parts, in which.

DETAILED DESCRIPTION

Raised source-drain MOSFETs are an alternative semiconductor device structure to that of conventional MOSFETS. Raised source-drain MOSFETs have several advantages over conventional MOSFETS, including decreased size over conventional MOSFETS. Raised source-drain MOSFETs, however, have proven difficult and impractical to manufacture. Thus, a method which enables the manufacturability of raised source-drain MOSFETs is disclosed.

Figure 3A:
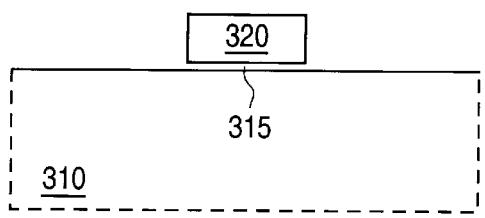
FIGS. 3A–3F are cross-sectional views of an HCS MOSFET device in various stages of formation, formed using a conventional process.

A process of forming a raised source-drain MOSFET (an HCS MOSFET, in particular) in accordance with conventional thought is described with reference to FIGS. 3A–3F. FIG. 3A shows substrate 310 with gate oxide 315 and gate 320. Typically, to form the structure of FIG. 3A, a gate oxide layer 315 is deposited or grown on substrate 310 and a polysilicon layer 320 is deposited over the gate oxide layer. Gate oxide layer 315 and polysilicon layer 320 are then patterned and etched to form the gate structure of FIG. 3A.

Figure 3D:
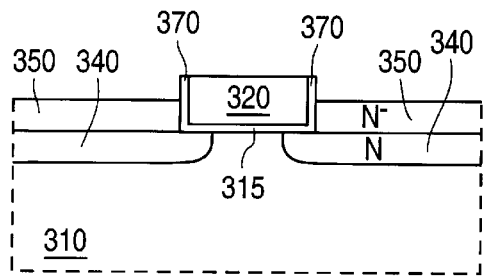
Figure 3B:
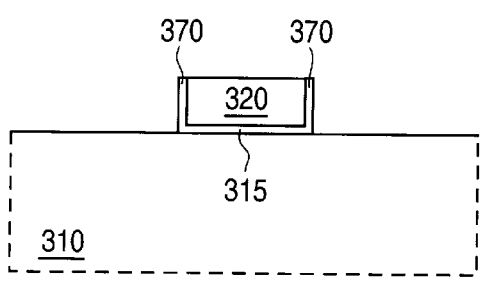

After the gate structure is formed, sidewall oxides 370 are formed by growing or depositing an oxide surrounding gate 320 to isolate the gate from the raised source and drain regions as shown in FIG. 3B.

Figure 3E:
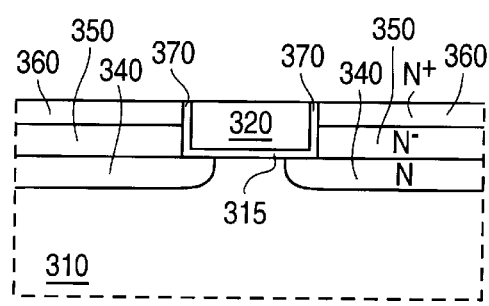
Figure 3C:
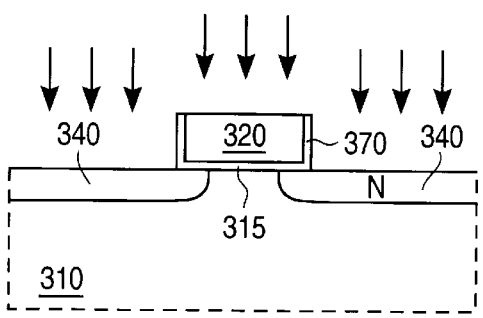

Once the gate has been adequately protected, source and drain regions 340 are formed by ion implantation or other known methods of introducing dopants into a substrate, as shown in FIG. 3C. FIG. 3C shows implantation with n-type dopants, however, it is to be understood here and throughout this description, that wherever n-type dopants are indicated, p-type dopants could be used instead.

Next, an N⁻ region 350 is selectively epitaxially grown on silicon substrate 310 over the source and drain regions 340 (sometimes referred to herein as source-drain regions). Epitaxial growth is a highly complicated process which is extremely difficult to control. Epitaxially grown N⁻ layer 350 has the same lattice structure as the substrate 310. The resulting structure is shown in FIG. 3D.

In FIG. 3E, a second epitaxial N⁺ layer 360 is selectively epitaxially grown over the N⁻ layer 350. Alternatively, rather than growing N⁺ layer 360, such a layer could also be formed by making a thicker N⁻ layer (in the step shown in FIG. 3D) and then ion implanting the uppermost region to make the uppermost region N⁺.

Figure 3F:
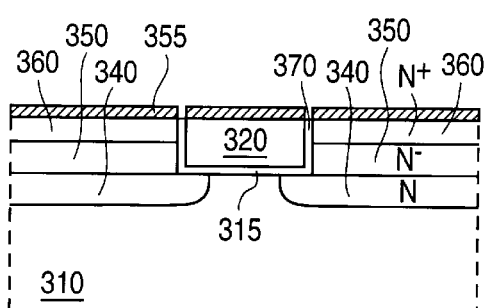

Finally in FIG. 3F, the raised source-drain regions 360 and gate region 320 is silicided—that is, a conductive material such as titanium is applied followed by heat cycles causing the conductive material to react with the silicon (but not the oxide) and form, for instance, $TiSi_2$ 355. Other silicide compounds may also be satisfactory. Typically, in conventional MOSFETs, as the silicide forms, it eats into and reduces the source and drain regions. However, with a raised source-drain MOSFET, the depth of source and drain regions 340 is not influenced by the silicide thickness.

Because selective epitaxial growth of layers 350 and 360 is difficult, and because the various heat steps, including those occurring during epi growth and silicide formation, cause diffusion of source and drain regions 340, the method described with reference to FIGS. 3A–3F is considered impractical.

Figure 4A:
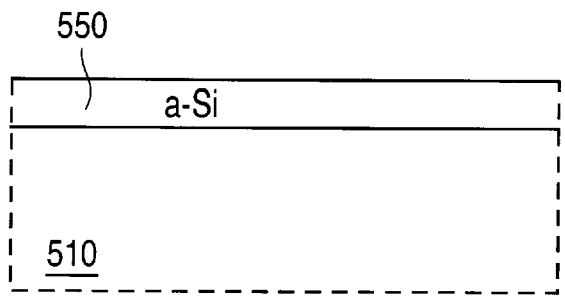
FIGS. 4A–4E are cross-sectional views of a raised source-drain MOSFET in various stages of formation, formed using a process in accordance with one embodiment of the invention.

Thus, in accordance with the invention, a method of forming a raised drain-source MOSFET is disclosed which avoids many of the above-discussed difficulties and which is described with reference to FIGS. 4A–4E. In FIG. 4A a layer of doped amorphous silicon 550 is deposited or otherwise formed over substrate 510. The amorphous silicon can be doped by ion implantation, in situ, or by other doping methods.

Figure 4B:
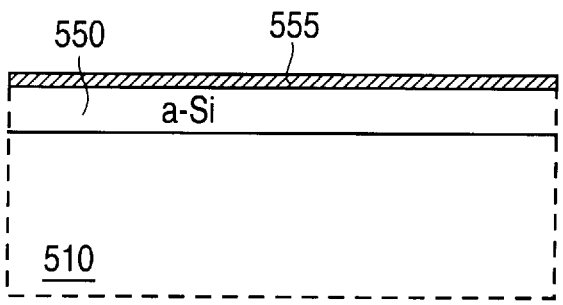

In one embodiment of the invention and shown in FIG. 4B, a silicide layer 555 is formed over doped amorphous silicon layer 550. The silicide layer 555 is typically formed by depositing titanium on the amorphous silicon (a-Si), and heating so that the titanium and silicon react, forming $TiSi_2$.

Typically, in conventional processes titanium is used for forming silicides because of its selective properties, i.e., at certain temperatures Ti does not react with oxides. In conventional MOSFET formation processes, this selectivity is important because oxide spacers are often used to separate the gate from the source and drain regions to prevent silicide from connecting the gate and source-drain regions, causing a short. Because the entire a-Si layer is to be silicided, however, a selective silicide process is not required in FIG. 4B, and thus other more conductive materials may be used instead of Ti.

Moreover, the silicide layer is applied to aid in conductivity and is not required in all embodiments of the invention. Thus FIG. 4B is indicated as "optional" and FIGS. 4C–4E do not show silicide layer 555. It is to be understood, however, that such a layer may be present in some embodiments of the invention. Embodiments of the invention forming a silicide layer as shown in FIG. 4B, however, allow the formation of gate oxides and/or gates at a lower temperature, thus allowing a material other than polysilicon to be used.

Figure 4C:
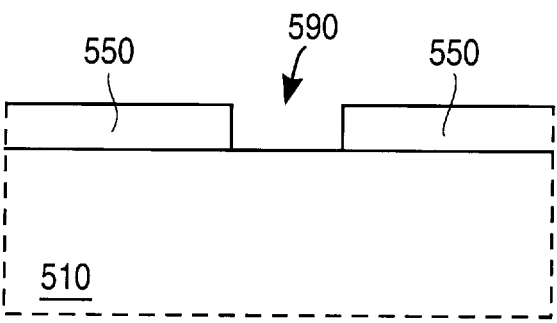

As shown in FIG. 4C, once the doped amorphous silicon layer 550 has been formed on substrate 510, layer 550 is patterned and etched to form window 590. An etch with a high selectivity between amorphous silicon and crystalline silicon (the substrate) is used, causing the substrate to serve as an etch stop layer. Importantly, the junction between substrate 510 and a-Si layer 500 also serves as a reference point, which allows for later controlled and self-aligned dopant placement in the substrate.

Figure 4D:
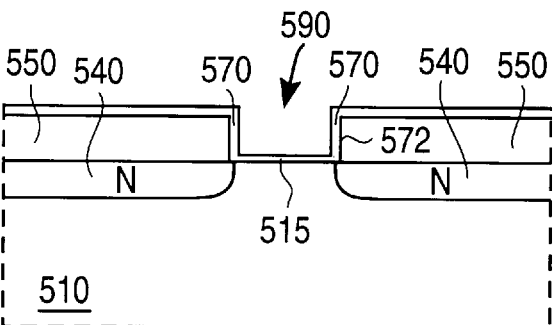

After the formation of window 590, the structure of FIG. 4C is heated to a temperature of approximately 800–1000° C. and exposed to an oxidizing ambient. The oxidizing ambient can be wet or dry and is generally known in the art. During this oxidizing step, a gate oxide will grow on substrate 510 forming gate oxide 515 (FIG. 4D). Simultaneously, sidewall oxides 570 will also be formed. The time required for this oxidation step will depend on the oxide thicknesses required to be formed. However, this oxidation step results in the oxide 570 on each of the window sidewalls 572 to be formed thicker than the gate oxide 515 because the sidewall oxides 570 are being grown from amorphous silicon, which grows a thermal oxide faster than crystalline silicon (the substrate). This thicker sidewall oxide will not only serve as a barrier to protect and isolate the gate from the raised source-drain regions, but it will also reduce capacitance between the gate and the source-drain regions. Capacitance between the gate and the channel region of the substrate is desirable, and thus a thin gate oxide 515 is also desirable. Both results (a thicker sidewall oxide and a thinner gate oxide) are obtained simultaneously with a single oxidizing step.

In addition, when growing the gate oxide and sidewall oxide, the high temperatures utilized will simultaneously cause dopants to be driven from the doped amorphous silicon 550 into the substrate 510 to form shallow source and drain regions 540.

Moreover, when heated to approximately 500° C. or more, amorphous silicon begins to become crystalline. Thus simultaneously with the growing of gate and sidewall oxides 515 and 570, the amorphous silicon layer 550 begins to recrystallize. Therefore, the doped amorphous silicon layer 550 will eventually resemble the epitaxial layer selectively grown in the process described in FIGS. 3A–3F.

Although the steps of forming a gate oxide, sidewall oxides, dopant diffusion, and recrystallization are described in the embodiment of the invention depicted in FIGS. 4A–4E as being performed simultaneously, in other embodiments, these steps could each be performed separately or some steps could be performed simultaneously while others are performed separately. For instance, in an alternative embodiment of the invention, substances other than an oxide can be used to form an insulating layer 515 and/or sidewall barrier layers 570. In such an alternative embodiment, however, the methods used in forming layers 515 and 570 will be altered accordingly, for instance, by depositing the material rather than growing it, and the ability to form the gate insulating layer simultaneously with the sidewall barrier layers may be lost. In addition, the ability to diffuse dopants into the substrate and/or recrystallize the a-Si layer simultaneously with the formation of layers 515 and 570 may also be lost.

Following formation of the structure of FIG. 4D, a gate material 520, such as polysilicon, is deposited over the structure of FIG. 4D. Other materials for forming a gate may also be suitable in other embodiments of the invention. The resulting structure is planarized, for instance with a chemical mechanical polish (CMP) or other known planarizing methods, and the structure of FIG. 4E results.

In some embodiments of the invention not utilizing a silicide step as described with respect to FIG. 4B, a silicide step can follow the formation of gate 520. Such a silicide step would be similar to that done conventionally and which was described with respect to FIG. 3F.

There are many alternatives available in the process described with reference to FIGS. 4A–4E. For instance, rather than forming a doped a-Si layer and a window 590 as described with respect to FIGS. 4A and 4C, an alternative embodiment of the invention utilizes steps described with respect to FIGS. 5A–5E. A layer 505 of material which can be selectively etched with respect to silicon, such as oxide, is grown or deposited on substrate 510, shown in FIG. 5A. The oxide is patterned and etched to reserve a gate region 507, FIG. 5B. A raised source and drain material 550, e.g., doped a-Si, is deposited over the structure, including the substrate 510 and reserved gate region oxide 507, resulting in the structure shown in FIG. 5C. The resulting structure is planarized by, for example, a chemical-mechanical polish (CMP), FIG. 5D. Finally, in FIG. 5E, the reserved gate region oxide 507 is removed, preferably using a wet etch process, to form window 590. Steps described with respect to FIGS. 4D and 4E would then be performed. The steps described with respect to FIGS. 5A–5E avoid the need for etch selectivity in forming window 590 and further avoid etch damage to the substrate surface upon which the gate oxide 515 will be grown or deposited.

Other embodiments of the invention could employ a doped epitaxial layer or silicon-germanium alloy, rather than using doped amorphous silicon. However, without amorphous silicon, many advantages would be lost. For instance:

1) if an a-Si layer is used for the raised source and drain, implant channeling during doping of the raised source-drain material is minimized and damage is confined to the a-Si layer, away from the critical parts of the device.

2) Epitaxial layers (epi) are difficult to grow, especially selectively, while forming a layer of amorphous silicon is not so difficult.
3) The etch selectivity between amorphous silicon and crystalline silicon is much better than between epi and crystalline silicon, allowing the formation of a window whose bottom edge serves as a reference point and with respect to which dopants to form regions 540 can be placed.
4) Amorphous silicon will behave as a more uniform doping source than epi or other polycrystalline material, making it a better solid diffusion source in forming the source and drain regions. (Grain boundaries provide a greater source of dopants than the grains, meaning that for a polycrystalline material, whose grains are large, it would be difficult to control the outdiffusion process).
5) Amorphous silicon also recrystallizes more readily than polysilicon and other substances. Polysilicon has grains with perfect crystals, however, these grains are not in alignment and thus more bonds must be broken to form a crystalline structure than with amorphous silicon, which has no grain order.
6) Using amorphous silicon also allows the ability to tailor the gate oxide and sidewall oxide to various thicknesses based on the material upon which they are grown (e.g., amorphous Si or crystalline Si).

Figure 1:
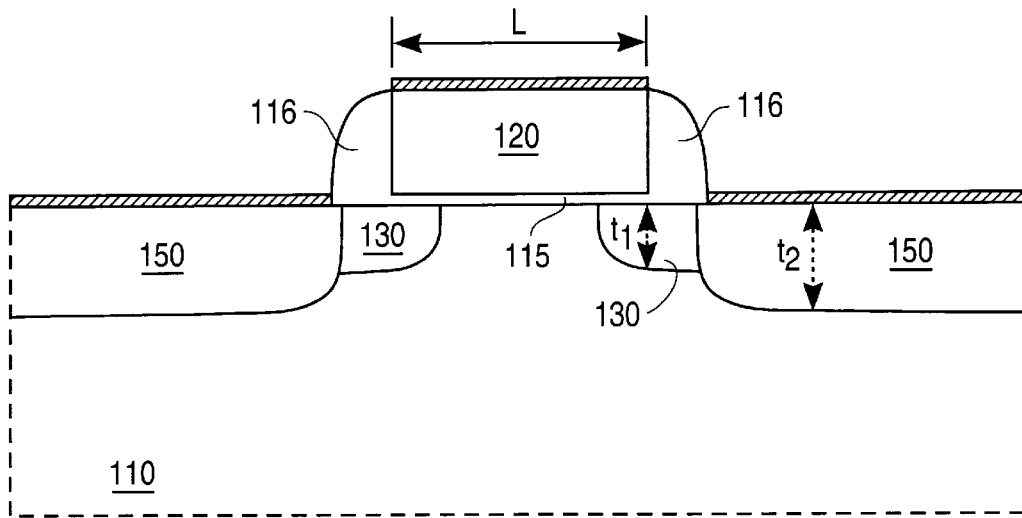
FIG. 1 is a cross-sectional view of a conventional MOSFET.
Figure 2:
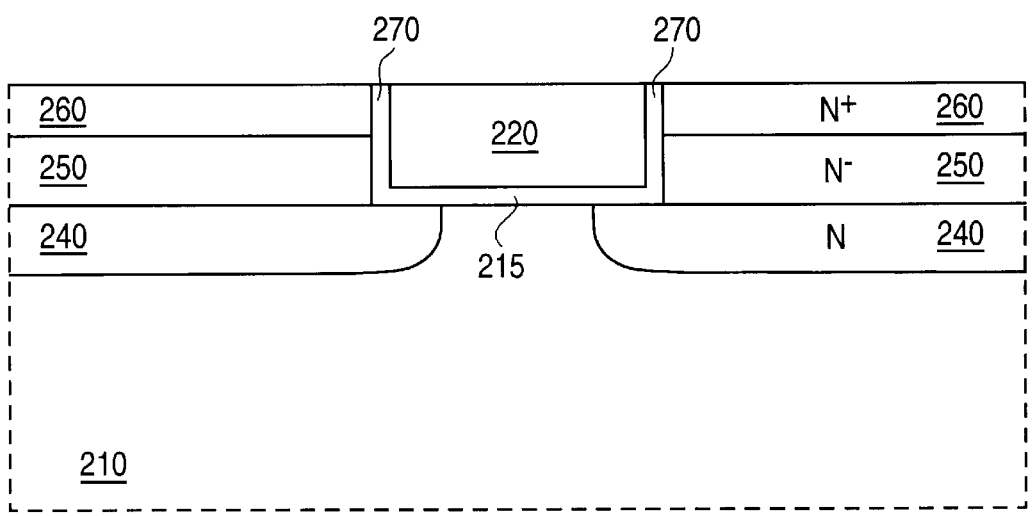
FIG. 2 is a cross-sectional view of an HCS MOSFET.
Figure 4E:
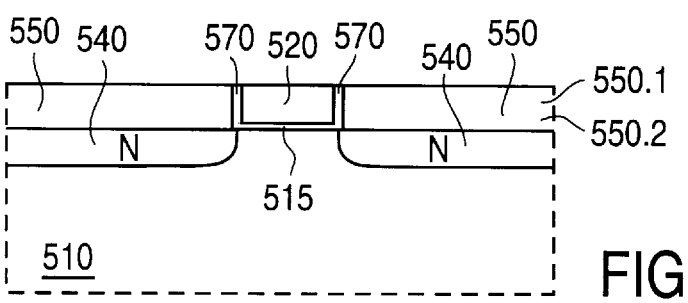
Figure 5A:
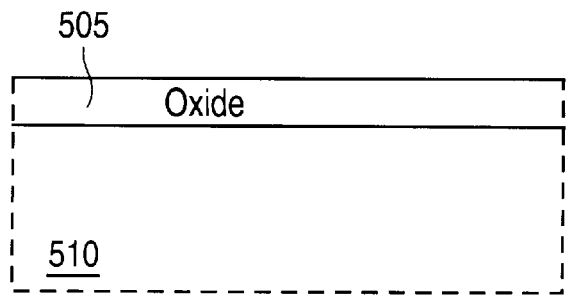
FIGS. 5A–5E are cross-sectional views of a raised source-drain MOSFET in various stages of formation, formed using a process in accordance with a second embodiment of the invention.
Figure 5B:
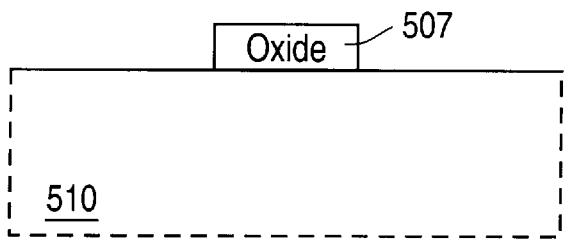
Figure 5C:
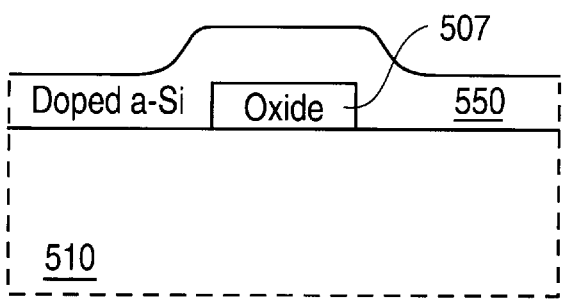
Figure 5D:
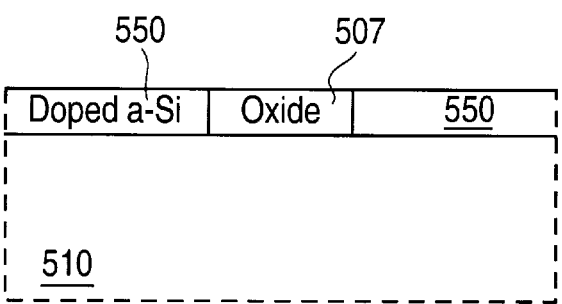
Figure 5E:
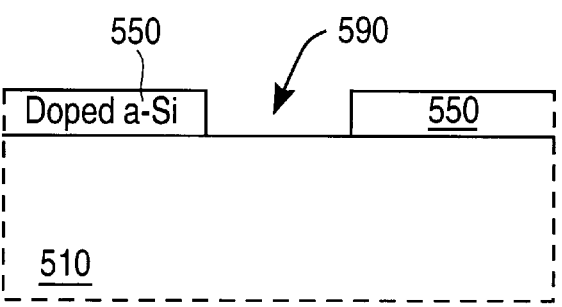

In some embodiments of the invention, a constant doping profile for layer 550 is utilized, while in other embodiments, layer 550 will have a variable doping profile formed by methods known to those of skill in the art. A variable doping profile could be tailored to minimize hot carriers (optimize hot-carrier suppression) while maintaining sufficient drive current (and minimizing sheet resistance) e.g., the doped amorphous silicon layer 550 could have a higher concentration of dopants in the upper portion 550.1 of the layer than the lower 550.2 (FIG. 4E). With a variable doping profile, the structure resulting in FIG. 4E will closely resemble that described with reference to FIG. 2.

Still other embodiments of the invention use alternative substrate materials. Such materials include silicon on insulator (SOI) or other multilayer substrates (e.g., Si—Ge on Si or Si on Si—Ge on Si).

Yet another alternative embodiment of the invention utilizes only a portion of the silicide steps described with reference to FIG. 4B. In such an embodiment, titanium (Ti) is deposited over the amorphous silicon layer 550. The heat steps, however, described with reference to FIG. 4B and used to cause the Ti to react with silicon are not performed immediately. Instead, TiSi$_2$ is formed during the heat steps for forming oxide layers 515 and 570, described with respect to FIG. 4D. Such an alternative embodiment further reduces the manufacturing steps required to produce a raised source-drain MOSFET.

In addition to enabling the manufacturability of raised source-drain MOSFETs and other advantages described above, a method in accordance with the invention is further advantageous. The order of source-drain formation avoids damaging the gate oxide since high temperature processes (e.g., epi formation and/or annealing) and any charging processes (e.g., ion implantation) occur before the gate oxide is formed. Moreover, a method in accordance with the invention avoids damaging the gate material, as the gate is not etched.

Another advantage of a method in accordance with the invention is that many steps can be performed simultaneously, e.g., forming the gate oxide, forming the sidewall oxide, diffusing dopants into the substrate, and recrystallizing the a-Si layer. The ability to perform the steps simultaneously with a single manufacturing step significantly reduces manufacturing costs.

A further advantage of a method in accordance with the invention is the fact that the resulting gate and the raised source-drain regions are planar. Planarity allows a much easier contact etch in later processing.

Figure 6:
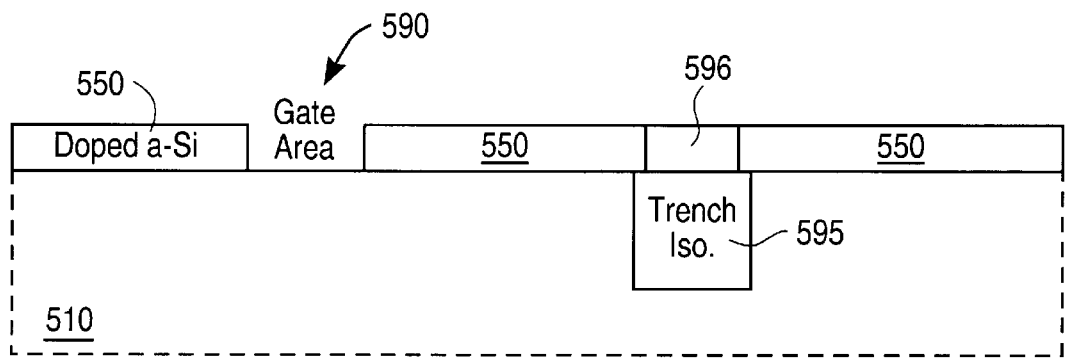
FIG. 6 is a cross-sectional view of a partially formed raised source-drain MOSFET, formed using a process in accordance with another embodiment of the invention which incorporates trench isolation.

Finally, a process in accordance with the invention is also advantageous in that it could be integrated with a trench isolation process and/or built-in local interconnects. For instance, with reference to FIG. 6, a trench isolation region 595 could be formed by methods generally known in the art before depositing the doped amorphous silicon layer 550. If a portion of doped amorphous silicon layer 550 over trench isolation region 595 is removed, region 596 is formed and can be filled with isolating material to separate the source and drain regions of adjacent transistors. Alternatively, if region 596 is not removed from layer 550, layer 550 will serve as an interconnect between adjacent transistors. In either case, use of a method in accordance with the invention will save steps and costs in the device manufacturing process.

Thus, a process has been described which allows the formation of a structure which will permit increased density, speed, and optimized hot-carrier suppression, while at the same time being easily manufacturable when compared with other methods of forming raised drain-source MOSFETs.

The invention has been described with respect to particular embodiments thereof, and it will be understood that numerous modifications are possible within the scope of the invention as set forth in the claims.

What is claimed is:

1. A method of forming a semiconductor device with a substrate, comprising the steps of:

forming over said substrate a layer of doped amorphous silicon having an upper surface and having a window therein, said window having a sidewall and exposing a portion of said substrate;

simultaneously forming a gate insulating layer on the exposed portion of said substrate, forming a sidewall barrier layer on said sidewall, forming a doped region in said substrate, and crystallizing said layer of doped amorphous silicon until said layer of doped amorphous silicon substantially resembles an epitaxial layer of silicon; and forming a gate in said window having an upper surface planar with said upper surface of said layer of doped amorphous silicon.

2. The method of claim 1, wherein the step of forming a layer of doped amorphous silicon, having a window therein, includes the steps of:

forming a layer of amorphous silicon over said substrate;

doping said amorphous silicon; and removing a portion of said layer of amorphous silicon.

3. The method of claim 1, wherein the step of forming a layer of doped amorphous silicon, having a window therein, includes the steps of:

forming over said substrate a layer of reserving material;

removing a portion of said reserving material layer such that a second portion of said reserving material layer reserves a gate region;

forming said layer of amorphous silicon over said substrate and said second portion of said reserving material layer;

planarizing said layer of amorphous silicon and said second portion of said reserving material layer; and removing said second portion of said reserving material layer.

4. The method of claim 1, wherein the step of forming a gate includes the steps of:

depositing a layer of gate material at least within said window; and planarizing said layer of gate material and said layer of doped amorphous silicon.

5. A method of forming a semiconductor device one a crystalline silicon substrate, comprising the steps of:

forming over said substrate a layer of doped amorphous silicon having a window therein, said window having sidewalls and exposing a portion of said substrate;

growing a gate oxide on said exposed portion of said substrate;

growing a sidewall oxide on said sidewalls;

driving dopants into said substrate from said layer of doped amorphous silicon;

crystallizing said layer of doped amorphous silicon until said doped amorphous silicon substantially resembles an epitaxial layer of silicon;

wherein said steps of growing a gate oxide, growing a sidewall oxide, driving dopants into said substrate, and crystallizing are performed simultaneously;

depositing a layer of polysilicon over said layer of doped amorphous silicon and within said window; and planarizing said layer of polysilicon with said layer of doped amorphous silicon.

6. The method of claim 5, wherein the step of forming a layer of doped amorphous silicon, having a window therein, includes the steps of:

depositing a layer of doped amorphous silicon over said substrate; and patterning and etching said layer of doped amorphous silicon.

7. The method of claim 5, wherein the step of forming a layer of doped amorphous silicon, having a window therein, includes the steps of:

forming an oxide layer over said substrate;

patterning and etching said oxide layer to form a reserved gate region oxide;

depositing a layer of doped amorphous silicon over said substrate and said reserved gate region oxide; and wet etching to remove said reserved gate region oxide.

8. The method of claim 5, wherein said step of depositing a layer of doped amorphous silicon includes:

depositing a layer of amorphous silicon; and doping said amorphous silicon.

9. The method of claim 6, further including the step of depositing a layer of titanium on said layer of doped amorphous silicon, preceding the step of patterning and etching.

* * * * *